US009609610B2

(12) United States Patent
Secker et al.

(10) Patent No.: US 9,609,610 B2
(45) Date of Patent: Mar. 28, 2017

(54) SYNCHRONIZATION DISTRIBUTION IN MICROWAVE BACKHAUL NETWORKS

(71) Applicant: Aviat U.S., Inc., Santa Clara, CA (US)

(72) Inventors: Philip Secker, Upper Hutt (NZ); Peter Croy, Bristol (GB)

(73) Assignee: Aviat U.S., Inc., Milpitas, CA (US)

( * ) Notice: Subject to any disclaimer, the term of this patent is extended or adjusted under 35 U.S.C. 154(b) by 108 days.

(21) Appl. No.: 14/613,264

(22) Filed: Feb. 3, 2015

(65) Prior Publication Data

US 2015/0156741 A1 Jun. 4, 2015

Related U.S. Application Data

(63) Continuation of application No. 14/060,503, filed on Oct. 22, 2013, now Pat. No. 8,983,015, which is a continuation of application No. 12/861,786, filed on Aug. 23, 2010, now Pat. No. 8,565,361.

(60) Provisional application No. 61/236,032, filed on Aug. 21, 2009.

(51) Int. Cl.

| | |
|---|---|
| ***H04L 7/00*** | (2006.01) |
| ***H04W 56/00*** | (2009.01) |
| ***H03L 7/18*** | (2006.01) |
| ***H03L 7/08*** | (2006.01) |
| *H04J 3/06* | (2006.01) |

(52) U.S. Cl.

CPC ........... *H04W 56/0015* (2013.01); *H03L 7/08* (2013.01); *H03L 7/18* (2013.01); *H04J 3/0602* (2013.01); *H04J 3/065* (2013.01); *H04J 3/0617* (2013.01); *H04J 3/0638* (2013.01); *H04J 3/0647* (2013.01); *H04J 3/0658* (2013.01); *H04J 3/0679* (2013.01); *H03L 2207/50* (2013.01); *H04J 3/0641* (2013.01); *H04J 3/0688* (2013.01)

(58) Field of Classification Search

CPC .. H04W 56/0015; H04B 7/269; H04B 7/2693
USPC ................ 375/354, 356, 367, 368, 371, 373
See application file for complete search history.

(56) References Cited

U.S. PATENT DOCUMENTS

| | | | |
|---|---|---|---|
| 5,761,255 | A | 6/1998 | Shi |
| 6,055,021 | A | 4/2000 | Twitchell |
| 7,495,516 | B2 | 2/2009 | Travis |

(Continued)

OTHER PUBLICATIONS

International Application No. PCT/US2010/046393, International Search Report and Written Opinion, Oct. 19, 2010.

(Continued)

*Primary Examiner* — Kevin Kim
(74) *Attorney, Agent, or Firm* — Sheppard, Mullin, Richter & Hampton LLP

(57) ABSTRACT

In some embodiments, a system comprises a clock, a root node, a radio channel network, and first and second child nodes. The clock may be configured to generate a clock signal. The root node may be configured to generate a first frame including a first payload and a first overhead and generate a second frame including a second payload and a second overhead. The first and second overheads may comprise a synchronization value based on the clock signal. The radio channel network may be in communication with the root node for transmitting the first and second frames. Each first and second child nodes may be configured to perform clock recovery including frequency synchronization using the synchronization value and a respective phase-lock loop.

22 Claims, 10 Drawing Sheets

(56) References Cited

U.S. PATENT DOCUMENTS

| | | | | |
|---|---|---|---|---|
| 8,355,476 | B2 * | 1/2013 | Lee | H04J 3/0667 375/354 |
| 2004/0046613 | A1 | 3/2004 | Wissell | |
| 2005/0149795 | A1 * | 7/2005 | Manoni | B61L 17/00 714/726 |
| 2005/0169233 | A1 | 8/2005 | Kandala et al. | |
| 2005/0286521 | A1 | 12/2005 | Chiang et al. | |
| 2008/0056258 | A1 | 3/2008 | Sharma et al. | |
| 2008/0181257 | A1 | 7/2008 | Addy et al. | |
| 2008/0298398 | A1 | 12/2008 | Eidson | |
| 2009/0094657 | A1 | 4/2009 | Miller et al. | |
| 2009/0304057 | A1 | 12/2009 | Werner et al. | |

OTHER PUBLICATIONS

European Patent Application No. 10810727.7, Search Report mailed May 14, 2014.

European Patent Application No. 10810727.7, Examination Report mailed Apr. 29, 2014.

* cited by examiner

SYNCHRONIZATION DISTRIBUTION IN MICROWAVE BACKHAUL NETWORKS

CROSS-REFERENCE TO RELATED APPLICATIONS

This application is a continuation of U.S. Non-Provisional application Ser. No. 14/060,503, filed Oct. 22, 2013, entitled, "Synchronization Distribution in Microwave Backhaul Networks," which is a continuation of U.S. Non-Provisional application Ser. No. 12/861,786, filed Aug. 23, 2010, entitled "Synchronization Distribution in Microwave Backhaul Networks," which claims priority to U.S. Provisional Patent Application No. 61/236,032 filed Aug. 21, 2009, entitled "Synchronization Distribution in Microwave Backhaul Networks," all of which are hereby incorporated by reference herein.

BACKGROUND

1. Field of the Invention

The present invention generally relates to data synchronization. More particularly, the invention relates to data synchronization across a network.

2. Description of Related Art

For reasons of ubiquity, capacity, efficiency and cost, Ethernet is regarded as the unifying transport layer of choice for network convergence. Ethernet backhaul will become universal over time and may replace traditional TDM backhaul.

For most operators Ethernet will be introduced on the back of existing TDM network connections given the huge investment in TDM network infrastructure. This will typically involve gradual migration using data overlay, with a decision at some future point to change to an all packet-based network.

A key consideration when engineering a change to Ethernet is synchronization. In particular, operators must determine how to replace the synchronization that typically occurs with Plesiochronous Digital Hierarchy (PDH) and Synchronous Digital Hierarchy (SDH) network connections. Operators may also consider how to provide synchronization of phase which is not supported by PDH and SDH network connections but is required for 3G and 4G/LTE TDD base stations.

Prior art methods to achieve clock sync transport over an all-IP network requires expensive new technology (e.g., in the form of packet delivery conforming to the IEEE1588 PTP standard). The prior art suffers from packet delay variation and/or asymmetric delays that present a problem for the PTP protocol especially with high user traffic loading conditions. Additionally, carrying PTP clock information along with user payload consumes valuable bandwidth.

For example, synchronous Ethernet and IEEE 1588v2 have been used in the prior art. Synchronous Ethernet uses the physical Ethernet layer to transport clock synchronization. Its operation is similar to that used in TDM networks, where a clock signal is injected into the bit stream to lock the physical layer clock. Each device in the network recovers, cleans, and then distributes the clock to its downstream neighbor. For end-end clock delivery, every intervening node (switch/router) within the network must support Synchronous Ethernet which requires expensive upgrades. Further, IEEE standardized Synchronous Ethernet cannot distribute phase alignment or time of day.

Packet-based IEEE 1588v2 performs frequency and phase synchronization, but, unfortunately, has traffic loading issues. IEEE 1588v2 is a Precision Timing Protocol (PTP) which provides a packet-based timing mechanism for phase and frequency synchronization. Dedicated timing packets are transmitted within the data packet stream to maintain a Master-Slave synchronization relationship. Time-stamped PTP packets are sent from the master clock to the slave clocks and from the slave clocks back to the master. A timing recovery algorithm uses these packets to calculate and offset the delays and differences in delay (packet delay variation or PDV) across a network.

SUMMARY OF THE INVENTION

In some embodiments, a system comprises a clock, a root node, a radio channel network, and first and second child nodes. The clock may be configured to generate a clock signal. The root node may be configured to generate a first frame including a first payload and a first overhead and generate a second frame including a second payload and a second overhead. The first and second overheads may comprise a synchronization value based on the clock signal. The radio channel network may be in communication with the root node for transmitting the first and second frames. Each first and second child nodes may be configured to perform clock recovery including frequency synchronization using the synchronization value and a respective phase-lock loop.

In some embodiments, the radio channel network includes a microwave network. The first child node may be configured to attenuate jitter of the first frame. The root node may be configured to generate a first series of frames for the first child node and to generate a first series of synchronization values for the first series of frames. Further, the root node may be configured to generate a second series of frames for the second child node and to use the first series of synchronization values for the second series of frames.

In various embodiments, the synchronization value includes a pseudorandom sequence. The overhead may further comprise a clock quality message. In some embodiments, each of the first series of synchronization values it he same value. The system may further comprise an MPLS node configured to provide data to the root node.

The system may further comprise an intermediate child node configured to receive the first frame from the root node before the first child node receives the first frame. The intermediate child node may be configured to attenuate jitter of the first frame.

In some embodiments, the overhead further comprises a clock quality message. Further, the first child node may be configured to select between the synchronization value and a second clock signal based, at least in part, on the clock quality message.

An exemplary method may comprise generating a clock signal, generating, by a root node, a first frame including a first payload and a first overhead wherein the first overhead comprises a synchronization value based on the clock signal, generating, by the root node, a second frame including a second payload and a second overhead wherein the second overhead also comprises the synchronization value, transmitting the first frame and second frame over a radio channel network, receiving, by a first child node, the first frame, performing, by the first child node, clock recovery including frequency synchronization using the synchronization value and a first phase-lock loop, receiving, by a second child node, the second frame, and performing, by the second child node, clock recovery including frequency synchronization using the synchronization value and a second phase-lock loop.

In some embodiments, an exemplary system comprises a clock, first and second child nodes, and a radio channel network. The clock may be configured to generate a clock signal. The system may further comprise a means for receiving the clock signal, for generating a first frame including a first payload and a first overhead, and for generating a second frame including a second payload and a second overhead, the first overhead comprising a synchronization value based on the clock signal, and the second overhead also comprising the synchronization value. The radio channel network may be in communication with the root node for transmitting the first frame and the second frame. The first child node may include a first phase lock loop, and may be configured to receive the first frame and to perform clock recovery including frequency synchronization using the synchronization value and the first phase lock loop. The second child node may include a second phase lock loop, and may be configured to receive the second frame and to perform clock recovery including frequency synchronization using the synchronization value and the second phase lock loop.

DETAILED DESCRIPTION OF THE INVENTION

Most mobile backhaul networks will evolve to be completely packet based. For mobile operators, the delivery of clock synchronization over these networks may be a primary issue. Unlike traditional PDH and SDH systems which deliver time-division multiplexing (TDM) line clocking, IP/Ethernet packet data is asynchronous by design (e.g., packets are sent and received without reference to frequency or time).

A mobile backhaul network may provide frequency and/or phase synchronization with specified accuracies to support 3G and 4G/LTE services. Some embodiments described herein may provide for frequency and/or phase synchronization and do not impact radio link payload.

Unlike synchronous Ethernet, where significant investment will be needed to implement it throughout a network, or IEEE 1588v2, which is in the early stages of trial deployment, embodiments described herein may provide TDM-quality clock synchronization independent of network loading. In one example, embodiments described herein may distribute a synchronous signal in the radio overhead to align 2.048 or 1.544 MHz PLL oscillators at remote sites.

In various embodiments, two or more nodes of a network may be upgraded to utilize some embodiments described herein using a plug-in card called a Network Synchronization Module (NSM). As a result, for example, operators with microwave links may retain carrier-class TDM clock synchronization and reduce or minimize IP migration risk.

Figure 1:
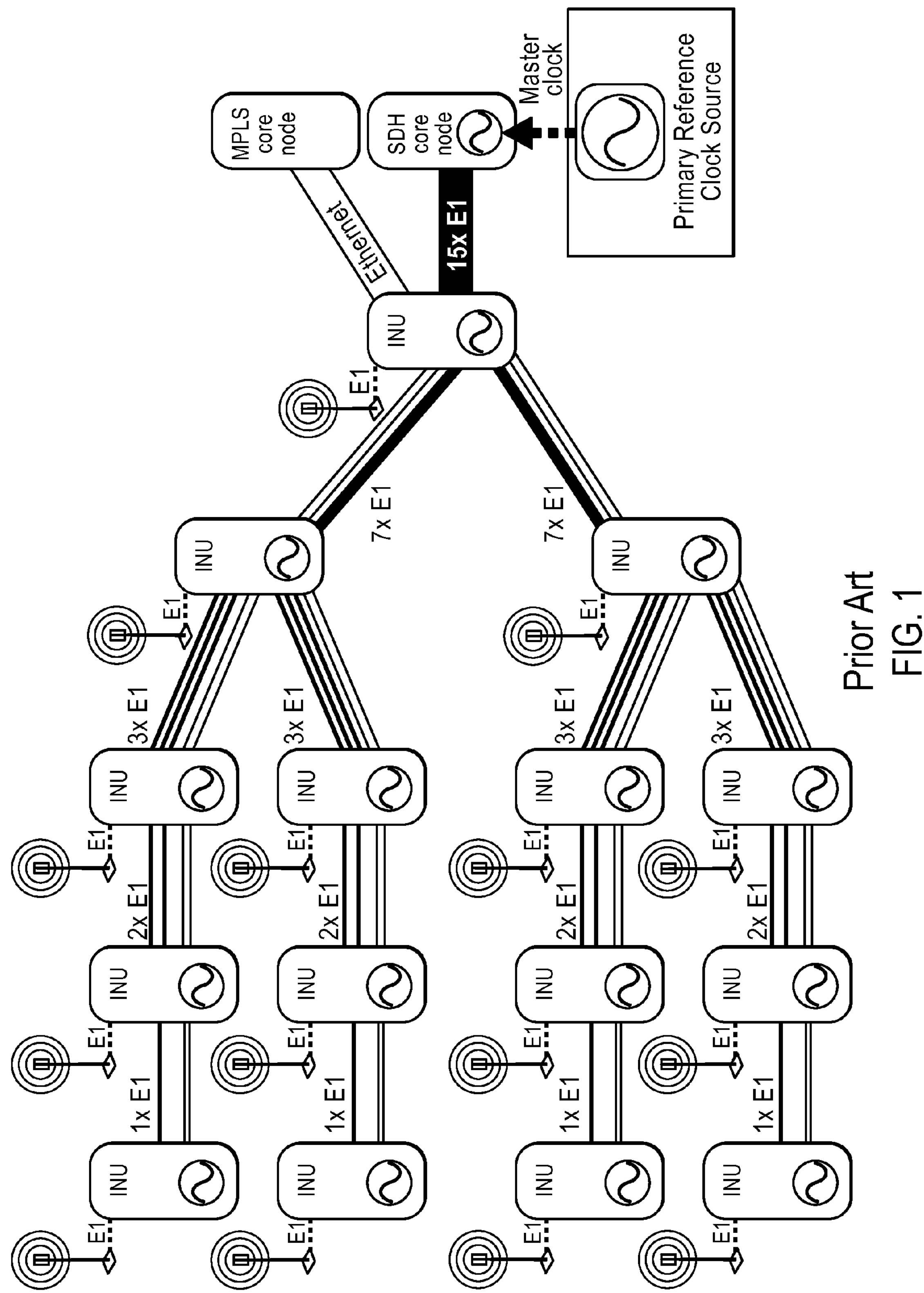
FIG. 1 is a mixed-mode network deployment with a mixture TDM E1's servicing co-located intelligent network units (INUs) and Ethernet for the NodeB in the prior art.

FIG. 1 is a mixed-mode network 100 deployment with a mixture TDM E1's (122, 124*a-b,* 126*a-d,* 128*a-d,* and 130*a-d*) servicing co-located Intelligent Node Units (INUs) 108, 110*a*-b, 112*a-d,* 114*a-d,* and 130*a-d* and Ethernet 120 for a NodeB in the prior art. An Intelligent Node Unit is a network node able to support multiple radio paths. In one example, each INU is a part of or comprises a Global System for Mobile Communication (GSM) base transceiver station (BTS). Each INU may comprise or be a part of, for example, a microwave node. The NodeB may also be a BTS.

In the mixed-mode network 100, a master clock signal 118 is provided by a primary reference clock source 102. The Synchronous Digital Hierarchy (SDH) core node 104 receives the master clock signal 118 and provides the master clock signal 118 to the INUs.

With the trend to migrate to IP, the GSM BTS traffic may be converted to use Abis optimization and Pseudowire to combine the traffic with NodeB. To retain the reliable TDM clocking, a minimum of a full E1 of bandwidth is required per site, aggregating to 15×E1's in this example. In this case, mixed-mode synchronization becomes inefficient, blocking valuable over-the-air bandwidth. Further, this form of synchronization does not support phase synchronization which is required for 3G and 4G/LTE TDD.

For example, this form of clock synchronization requires that at least one E1 line be reserved for every INU supported. Since there are 15 INU depicted in FIG. 1, 15 E1 channels are reserved. Similarly, since INU 110*a* supports 6 INUs, seven E1 channels 124*a* are reserved between the INU 110*a* and the INU 108 (i.e., six for the supported INUs and one for INU 110*a*).

INU 108 also receives data from the multiprotocol label switching (MPLS) core node 108 over Ethernet 120. The INU 108 provides the data as well as seven of the E1 channels to INU 110*a*. The INU 108 also provides data as well as seven other E1 channels to INU 110*b*.

In other words, each INU utilizes one E1 channel and passes the rest of the E1 channels to supported nodes. For example, INU 110*a* provides three E1 channels 126*a* to INU 112*a* and three E1 channels 126*b* to INU 112*b*. INU 112*a* provides two E1 channels 128*a* to INU 114*a* which provides a single E1 channel 130*a* to INU 116*a*. INU 112*b* provides two E1 channels 128*b* to INU 114*b* which provides a single E1 channel 130*b* to INU 116*b*.

Similarly, INU 110*b* provides three E1 channels 126*c* to INU 112*c* and three E1 channels 126*d* to INU 112*d*. INU 112*c* provides two E1 channels 128*c* to INU 114*c* which provides a single E1 channel 130*c* to INU 116*c*. INU 112*d* provides two E1 channels 128*d* to INU 114*d* which provides a single E1 channel 130*d* to INU 116*d*.

Figure 2:
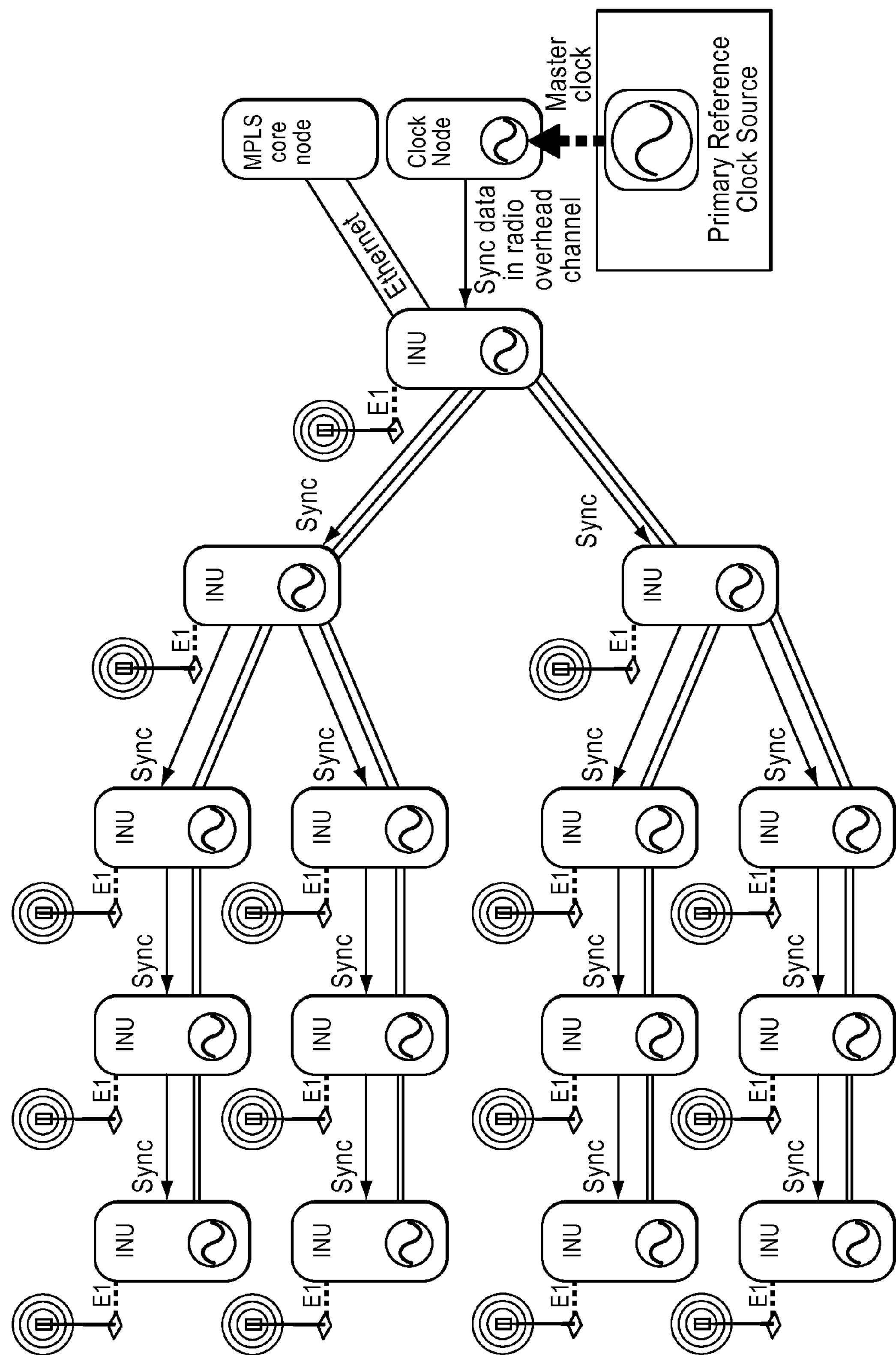
FIG. 2 is depicts a 'distributed sync' between microwave nodes using the radio overhead channel in some embodiments.

FIG. 2 is depicts a distributed synchronization between INUs using a radio overhead channel in some embodiments. In various embodiments, a distributed synchronization is provided between INUs using the radio overhead channel. In some embodiments, this solution may scale to large IP backhaul access networks while maintaining an IP packet transport scheme over the microwave links.

Those skilled in the art will appreciate that some embodiments described herein do not suffer from packet delay variation or asymmetric delays that present problems of the PTP protocol. Further, operators may, in some embodiments, transition from E1/DS1 synchronization to distributed synchronization very smoothly without taking the large step of committing to PTP. For instance, existing E1 timing circuits can be replaced with distributed synchronization on a point to point basis, gradually releasing aggregated TDM circuits for other uses.

In some embodiments, a master clock signal 118 is provided by a primary reference clock source 102 to the clock node 202. The clock node 202 receives the master clock signal 118 and provides the master clock signal 118 to the intelligent node units (INUs).

The clock node 202 and/or the INU 108 may generate a frame that includes a payload for data as well as overhead. In some embodiments, a root node comprises the clock node 202 and/or the INU 108. The overhead may be used to store a synchronization value. The synchronization value may be the clock signal, a value associated with the clock signal, and/or a random value (e.g., a pseudorandom binary sequence) that is generated by the clock node 202 and/or the INU 108. The synchronization value may be used by one or more other INUs for frequency and phase synchronization. In one example, the synchronization value may be used to align PLL oscillators at remote sites.

Those skilled in the art will appreciate that embodiments described herein may be utilized in a mixed environment. For example, the clock node 202 may provide a synchronization value in a frame that is delivered to INU 108 which may then dedicate seven E1 channels to provide a clock signal or synchronization value to the INU 110*a*. In another example, the INU 108 may provide a synchronization value in the frame to INU 110*a* which may then dedicate three E1 channels 126*a* to provide a clock signal or the synchronization value to INU 112*a*. In some embodiments described herein, operators may transition from the use of E1 channels (i.e., tributaries) in stages and maintain operation of the network rather than being required to convert to an entirely packet-based network.

In some embodiments, INU 108 receives data from the MPLS core node 106 over Ethernet 120. The INU 108, when generating the frame, may store the synchronization value in the overhead of the frame while storing the data received from the MPLS core node 106 in the payload of the frame. The frame may be provided to one or more other INUs (e.g., INUS 110*a*-110*b*). The frame may be a traditional frame, a packet, datagram, or any other form of data transmission unit.

In one example, INU 108 may comprise a card (e.g., a NSM) that is configured to receive the clock signal from the clock node 202 and generate the frame. The NSM may generate the synchronization value associated with the clock signal. The synchronization value may then be stored in the frame (see FIG. 3).

In some embodiments, frequency synchronization and/or clock recovery is performed by another NSM. Those skilled in the art will appreciate that not all INUs require an NSM. In one example, only the INU that receives the clock signal (e.., INU 108) and a terminal INU (i.e., an INU that communicates directly with customer equipment rather than to another INU) comprise an NSM. In a further example, the INU 108 with an NSM generates a plurality of frames with a synchronization values. The frames may be received by INU 116*a* with NSM. The INU 116*a* utilizes the synchronization value for frequency synchronization and/or clock recovery. The INUs in between INU 108 and INU 116*a* (i.e., INUs 110*a*, 112*a*, and 114*a*) may not comprise an NSM and may relay the frame and/or synchronization value. In some embodiments, the INUs in between the INU 108 and the INU 116*a* will correct for jitter and wander of the frame, contents of the frame, and/or the synchronization value.

Those skilled in the art will appreciate that each INU may be upgraded and/or configured to perform jitter attenuation and/or wander attenuation of one or more frames and/or synchronization values. In other embodiments, many or all INUs may not perform jitter attenuation and my not be upgraded or altered.

The NSM may comprise an E1/DS1/Clock interface. The E1/DS1/Clock interface may provide an electrical translation between the user's external E1/DS1 or Clock Synchronization Interface formatted signals to TTL level signals processed by the radio system. The interface may physically attach to 3× RJ45 connectors (E1/DS1) and one pair of mini-BNCs (clock interface). Those skilled in the art will appreciate that there may be any number of connectors of any type. In one example, a line interface of the E1/DS1/Clock interface may be implemented using a Cirrus Logic 61884 octal LIU or similar device. Pulse shapes may conform to relevant G.703 specs for E1, DS1 and Clock interface.

The NSM may be capable of operating in an E1 and DS1 mode, whereby a line build out and line codes may be software configurable, per tributary. The NSM may support Y cables for protection. Support for this function may be obtained by switching out input termination resistors on the offline card.

Those skilled in the art will appreciate that frequency synchronization may be required for 2G and 3G FDD base stations, and frequency and phase (relative time) synchronization may be required for 3G and 4G/LTE TDD base stations. Further, in some embodiments, synchronization may be needed for pseudowires used to transport legacy TDM traffic over Ethernet network connections.

In some embodiments, frequency synchronization (syntonization) comprises ensuring master and slave clocks are aligned in frequency. Phase synchronization may comprise ensuring that clocks are aligned in phase and to thereby have the same relative time. Clocks synchronized in phase may also be synchronized in frequency.

In various embodiments Universal Mobile Telecommunications System Frequency-Division Duplexing (UMTS-FDD) base stations require synchronization in frequency only, with a synchronization accuracy to 50 ppb. Base station synchronization may be needed to support optimum handoff between cells, and to ensure frequencies on the air-interfaces have the accuracy and stability needed to minimize channel interference. This 50 ppb accuracy may be supported over existing TDM network connections via a clock embedded in SDH or PDH frames. Systems and methods described herein may provide equivalent accuracy over a packet-switched Ethernet backbone. Examples of FDD cellular technologies include GSM, GPRS, EDGE, CDMA, and WCDMA.

Various embodiments described herein provide an option for base station synchronization when data services are overlaid on existing TDM networks. Further, various embodiments described herein may provide solutions applicable to IP/Ethernet backhaul over microwave radio.

In various embodiments, UMTS-Time-division duplexing (UMTS-TDD) base stations require both frequency and phase synchronization. Base stations may be phase aligned to ensure frames transmitted by neighboring stations are aligned in time (relative time) for channel handover and minimization of cross-channel interference. The phase accuracy required may be in the order of 1 us to 10 us, depending on the system. Currently, GPS may be required for this level of accuracy. Examples of TDD technologies include WiMAX-TDD, TD-CDMA and TD-SCDMA. There is no standardized solution for network delivery of real time to the required level of accuracy in the prior art.

Although frequency synchronization is discussed, those skilled in the art will appreciate that some embodiments may be used for phase synchronization as well.

Figure 3:
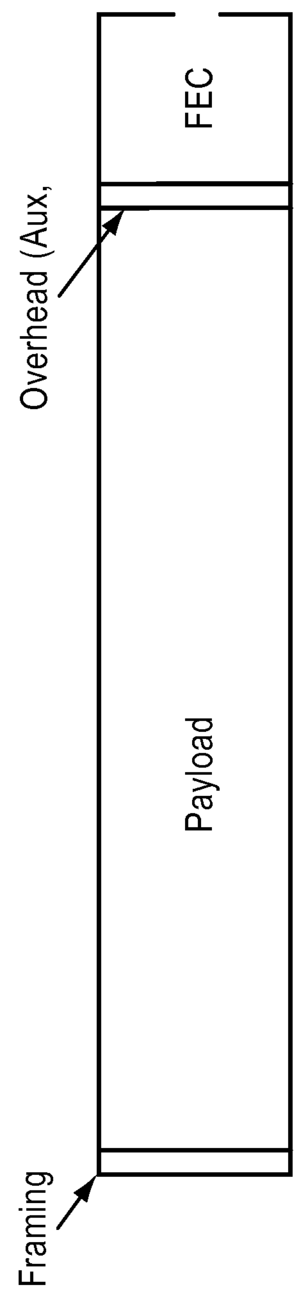
FIG. 3 is a diagram of an exemplary frame in some embodiments.

FIG. 3 is a diagram of an exemplary frame 300 in some embodiments. In some embodiments, an INU constructs a frame that comprises a payload 302, overhead 304 for network management communication and small bit rate Aux channels, and forward error protection (FEC) 306. The overhead channels may be a small proportion (e.g., 256 kbits) of the payload channel (e.g., 8 Mbits upwards to 300 Mbits). In one example, the INU comprises a radio access card configured to construct the frame 300. In some embodiments, a microwave radio link comprises outdoor units (ODUs) which perform frequency translation to and from microwave radio channels.

In some embodiments, data (e.g., voice data) is stored in the payload 302 and a synchronization value is stored in the overhead 304. For example, the synchronization value may comprise 64 kbits. Those skilled in the art will appreciate that the synchronization value may comprise any bit rate. In various embodiments, when packets are generated, all or part of the overhead is unused. By transferring the synchronization value via the overhead, synchronization may be accomplished without reducing valuable payload space.

In some embodiments, the overhead of the frame 300 may comprise a message (e.g., an SSM message) in this channel. The SSM message may comprise status or control information. In one example, the status or control information comprises a message describing the quality of the synchronization value. The quality of the clock signal from the master clock and/or synchronization value based on the clock signal from the master clock may be very high. As the number of INUs increase, however, jitter or wander may reduce the quality of the clock signal and/or synchronization value. The message in the overhead may be updated accordingly to provide information regarding the quality of the clock signal and/or synchronization value to other INUs.

In various embodiments, a first INU may receive one or more clock signal(s) and/or synchronization value(s) from another INU. The first INU may also receive a second clock signal from another source such as a GPS. If, based on the message in the overhead, the first INU determines that the second clock signal may be more accurate, then the first INU may utilize the new clock signal from the GPS. Similarly, the first INU may provide the new clock signal and/or synchronization value associated with the new clock signal to other INUs or customers.

Figure 4:
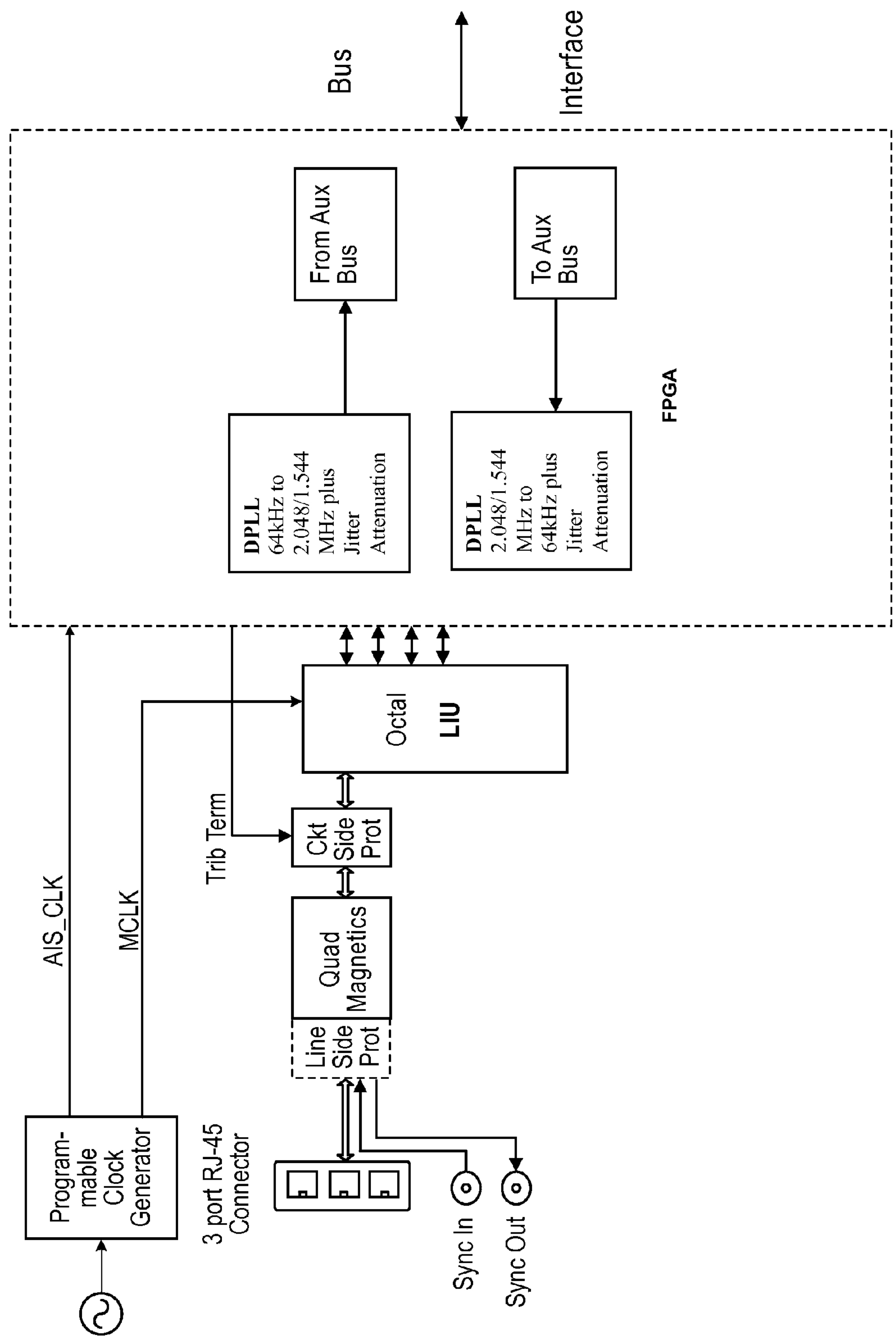
FIG. 4 is a diagram of a network synchronization module (NSM) in some embodiments.

FIG. 4 is a diagram of a network synchronization module (NSM) 400 in some embodiments. In various embodiments, the NSM 400 provides connectivity between the E1/DS1 or 2.048/1.544 MHz clocks and the INU TDM buses' 64 kbit/s Auxiliary channels for the purpose of carrying clock timing information across a network using the overhead channels in the radio section. The NSM 400 may provide a rate conversion from 2.048/1.544 MHz to 64 kHz and reduce or minimize jitter and wander accumulation.

In some embodiments, the NSM 400 comprises an optional programmable clock generator 402, a 3 port RJ 45 connector 404, a sync in port 406, a sync out port 408, quad magnetics 410, a ckt side prot. 412, a line-in unit (LIU) 414, and an FPGA 416. The FPGA 416 may comprise a DPLL 420 for providing a synchronization value to an auxiliary channel and a DPLL 418 for providing a synchronization value to a bus.

For example, the the programmable clock generator 402 may provide a master clock signal to the LIU 414 and an AIS_Clk signal to the FPGA 416. Those skilled in the art will appreciate that the clock signal may be received from any clock generator that may or may not be a part of the NSM 400.

The quad magnetics 410 may be configured to send or receive information via the 3 port RJ-45 connector 404. Further, the quad magnetics 410 may be configured to provide information via the sync out port 408 or receive information via the sync in port 406. The ckt side pro 412 is configured to provide information between the quad magnetics 410 and the LIU 414.

The LIU 414 may provide the information to the FPGA 416. The DPLL 418 may receive a synchronization value from a frame. The DPLL 420 may attenuate jitter and convert the synchronization value from 64 kHz to 2.048/1.544 mHz. Similarly, the DPLL 418 may attenuate jitter and convert the synchronization value from 2.048/1.544 mHz to 64 kHz.

In some embodiments, a synchronization value may be received via the sync in port 406 and/or the 3 port RJ-45 connector 404. Similarly a clock signal and/or synchronization value may be provided by the the sync out port 408 and/or the 3 port RJ-45 connector 404.

The FPGA/DPLL 416 may provide connectivity between the LIU 414 and the INU TDM backplane bus 422. The FPGA/DPLL 416 functions may include clock rate conversion from (in conjunction with a programmable DPLL) to 64 kHz, and TDM bus write/read to Auxiliary channels. In some embodiments, the FPGA 416 function comprise off-the-shelf devices such as the Xilinx Spartan 3 1000 series FPGA. The FPGA 416 may contain a programmable block to select one auxiliary channel on the TDM bus for the purposes of carrying 2.048 or 1.544 MHz clocks. Bit stuffing and de-stuffing may be used on the dedicated backplane timeslot.

In some embodiments, the FPGA 416 and DPLL (418 and/or 420) may provide rate adaptation to convert one or more of the three designated E1 or DS1 inputs or the clock input from the user to the auxiliary channel. The FPGA 416 and DPLL (418 and/or 420) may provide rate adaptation to convert one auxiliary channel to 2.048 or 1.544 MHz to be commonly fed to one or more LIU 414 output ports towards the user.

The FPGA 416 may allow a user input (E1/DS1 or clock) to be optionally fanned out to all output ports (i.e. not taking timing from the backplane). In this way the NSM 400 may acts to source timing to the backplane and replicate timing elsewhere (e.g., to another INU).

In some embodiments, the FPGA 416 and DPLL (418 and/or 420) may remove jitter on the auxiliary channel from the TDM bus such that single and multiple radio hops meet system wide (G.823) jitter and wander specifications. The FPGA 416 may provide a pseudorandom pattern generator towards the user for those LIU ports carrying E1s or DS1s. The pseudorandom pattern generated may be user configurable to include, for example, $2^{15}$-1 and $2^{20}$-1

The FPGA 416 may carry an AIS (all ones) signal to the user (E1/DS1s) when the timing signal is lost (e.g. radio path down). Further, the FPGA 416 may enable tributary input impedances to change depending on whether the card is operating in protected 'Y' cable mode or not.

Figure 5:
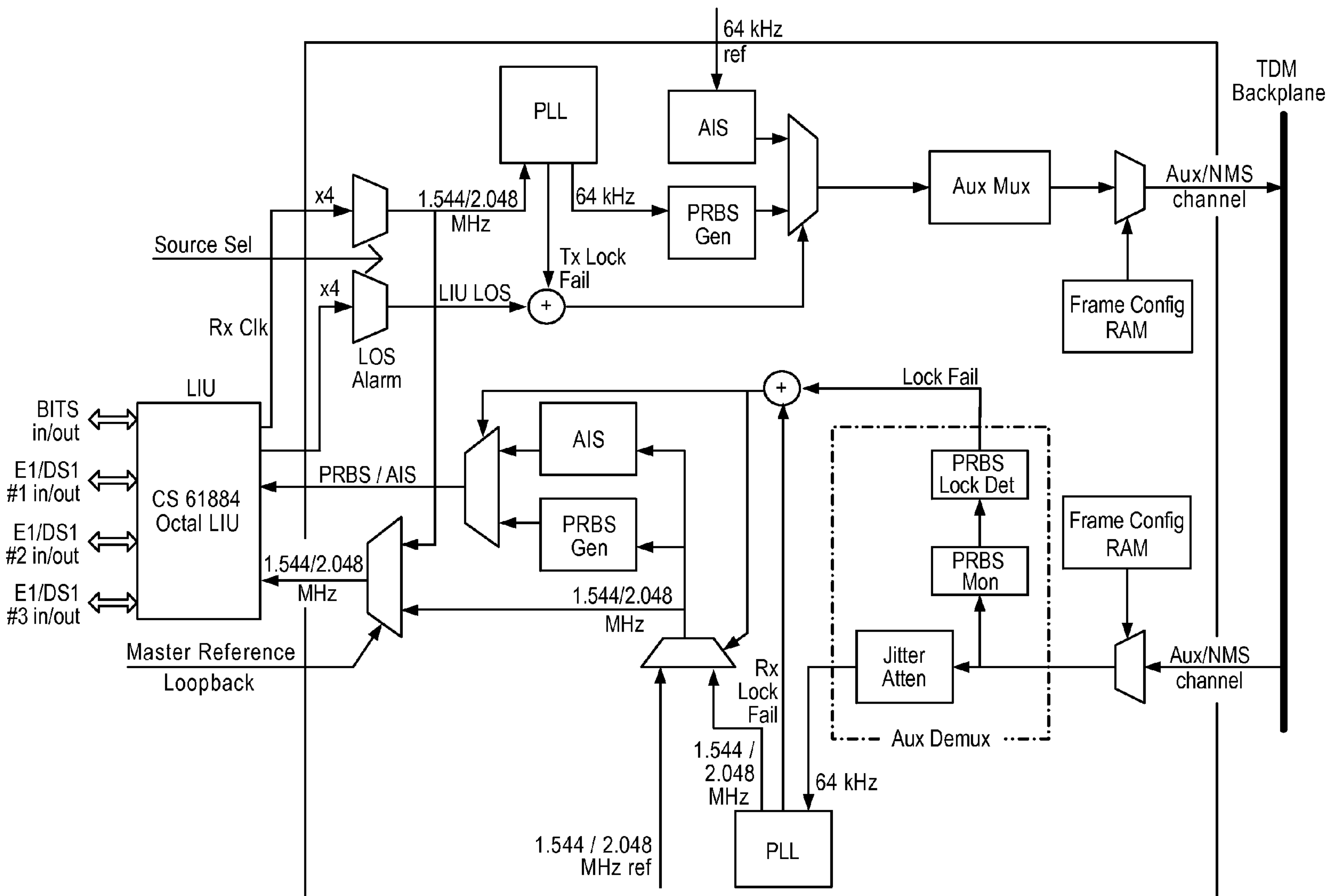
FIG. 5 is a diagram of an exemplary field-programmable gate array (FPGA) in some embodiments.

FIG. 5 is a diagram of an exemplary field-programmable gate array (FPGA) 418 in some embodiments. In various embodiments, the FPGA 416 performs the clock conversion function while minimizing jitter and/or wander that accumulates as the clock transitions from NSM 400 to the TDM backplane 522 to radio path and onwards through potentially many radio paths before exiting at another NSM. Each hop whether between NSMs via the backplane or between cards via microwave links has the potential to introduce jitter and wander especially where a bit stuffing technique is used to carry signals across clock boundaries.

In some embodiments, the NSM 400 performs jitter attenuation of the 64 kHz auxiliary channel at the NSM backplane interface and potentially other interfaces depending on the performance requirements. In one example, a radio access card may combine the auxiliary data with other backplane traffic (e.g., IP traffic) prior to transmission through a modem over a microwave radio network.

In some embodiments, the 64 kHz Aux channel may carry a random data pattern (i.e., a synchronization value) across the microwave network, in order, in some embodiments, to convey data at an average rate, but ignoring the actual data itself. The average rate of data arriving at the NSM 400 from the TDM backplane 522 may be used to regenerate a smoothed clock multiplied up to the user ports which may be the function of the PLL described herewith.

The FPGA 416 may comprise mux 502 and loss of signal (LOS) alarm mux 504 which receive information from the LIU 414. A source select signal may control the mux 502 and/or the LOS alarm mux 504. In some embodiments, a clock signal may be provided to the FPGA 416 from the LIU 414. A PLL 506 may receive the clock signal via the mux 502. The clock signal may be at 1.544 or 2.048 MHz. The PLL 506 may downconvert the clock signal from the LIU 414 from 1.544/2.048 MHz to 64 KHz. Those skilled in the art will appreciate that the clock signal may be downconverted to any value. The downconverted signal may be provided to a pseudorandom binary sequence (PRBS) generator 508 which generates a PRBS.

A second clock signal may also be received by the AIS 510. A mux 514 may select between the clock signal of the AIS 510 or the PRBS from the PRBS generator 508. The mux 514 may be controlled by a signal indicating a loss of signal from the LIU 414 or a failure of the PLL 510 to lock. If there is a loss of signal or failure of the PLL 506 to lock, the mux 514 may select the signal from the AIS 510. The Aux Mux 516 receives the output of the mux 514. The frame config. RAM 520 may be configured to control mux 518 to control placement of the synchronization value on the TDM backplane 522.

The frame config. RAM 526 may control mux 524 for retrieving a synchronization value from the TDM backplane 522. An Aux demux may receive the synchronization value from the mux 524. The Aux demux comprises a jitter attenuator 532, a PRBS monitor 528, and a PRBS lock detector 530. The PRBS monitor 528 may receive the synchronization value and the PRBS lock detector 530 may receive a signal from the PRBS monitor 528. The jitter attenuator 532 attenuates jitter (if any) of the synchronization value from the mux 524. The PLL 534 may upconvert the synchronization value from the jitter attenuator 532 (e.g., from 64 kHz to 1.544/2.048 MHz).

A mux 538 may select between a 1.544/2.048 MHz reference signal and the signal from the output from the PLL 534. The mux 538 may select the 1.544/2.048 MHz signal if the PLL 534 lock fails or the PRBS lock detector 530 indicates a lock fail. The AIS 540, the PRBS generator 542, and the mux 546 may receive the output from the mux 538. The mux 544 selects between the signal received from the AIS 540 and the PRBS from the PRBS generator 542. The mux 544 may be controlled by the lock fail signal from the PRBS lock detector 530 and/or the PLL 534 lock failure signal. The output of the mux 544 is provided to the LIU 414. The mux 546 is controlled by a master reference loopback to select between a 1.544/2.048 MHz signal and the output of mux 538. The output of mux 546 is provided to LIU 414.

Those skilled in the art will appreciate that the PLL 506 and/or the PLL 534 may be digital PLLs.

Figure 6:
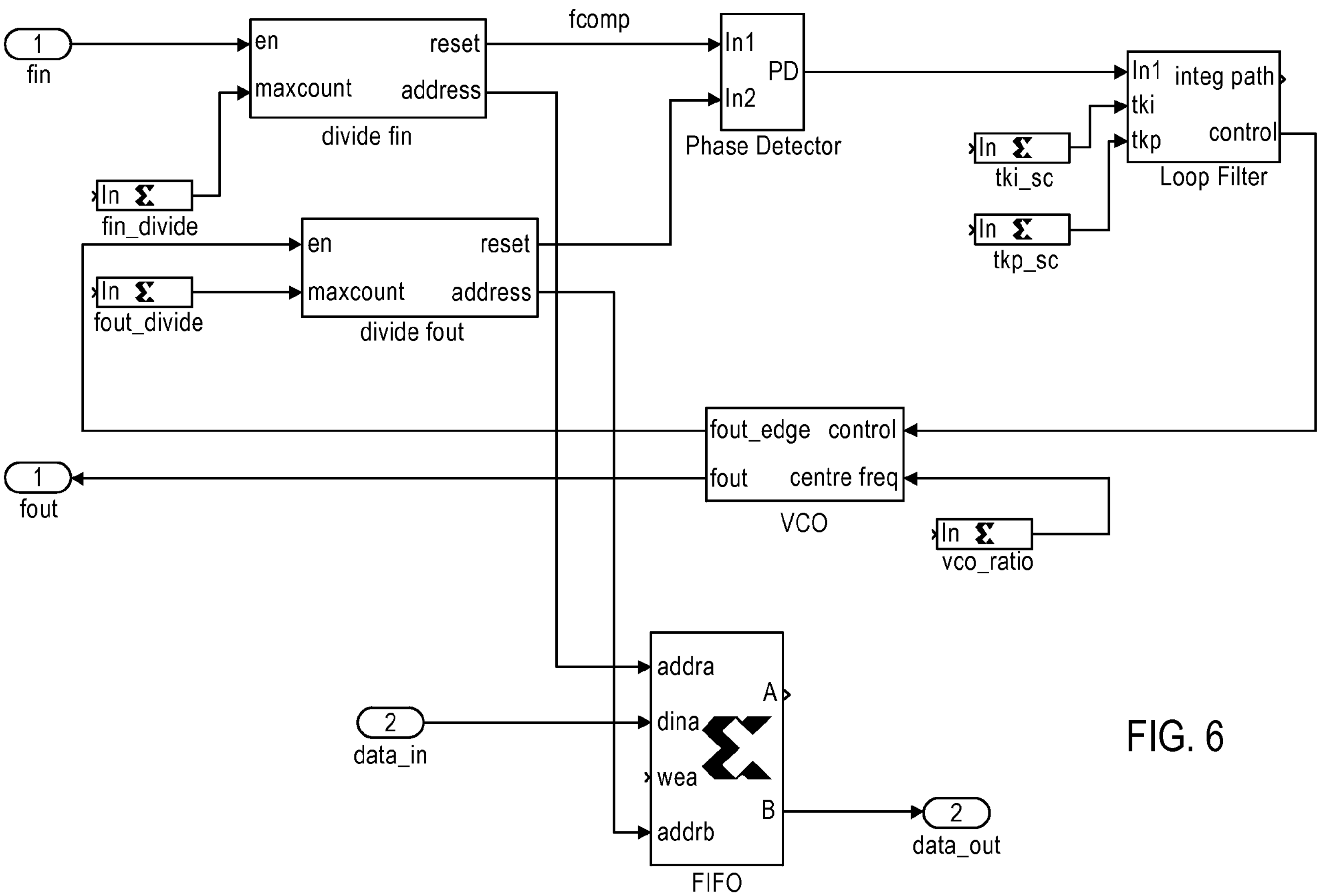
FIG. 6 is a diagram of a phase-locked loop (PLL) with a jitter attenuator in some embodiments.

FIG. 6 is a diagram of a PLL 600 with a jitter attenuator in some embodiments. A PLL on the FPGA 416 (or elsewhere on the NSM) may be used to change frequencies and/or smooth phase variations of a clock. The PLL 600 depicts a model of a PLL whereby the incoming clock frequency may be divided (e.g., by divider 602) down to a common comparison frequency at the input to a phase detector 604. The phase detector output may feed a loop filter 608 which drives a VCO 610. This may be an output clock, a sample of which may be fed back to the phase detector 604 to close the loop. Depending on the position of the DPLL 600 in the system, the dividers 602 and 612 may convert input to output frequencies. For instance, 2.048 MHz may be divided by 256 to give a comparison frequency of 8 kHz and the VCO 610 output of 64 kHz may be divided by 8 to match this comparison frequency. This is one possible configuration of the NSM input to backplane PLL direction. Similar ratios can be used in the reverse direction.

Pure jitter attenuation (i.e., without clock frequency changing) may be achieved by setting the dividers to equal values, and using the divider counters to address FIFO 614 write and read pointers. With a suitable phase detector (for example the commonly known JK flipflop) and when locked, the PLL 600 may align the read and write to be maximally apart, thus allowing for system induced phase variation to be absorbed and data to be passed without or with little error.

The selection of loop filter 608 may set the order of the PLL 600. In one example, a proportional and integral loop filter 608 may be used to give a second order loop with independently settable loop bandwidth and damping factors. These two factors may determine the level of jitter and wander presented at the output and considerable opportunity is available to optimizing these for a given system.

Figure 7:
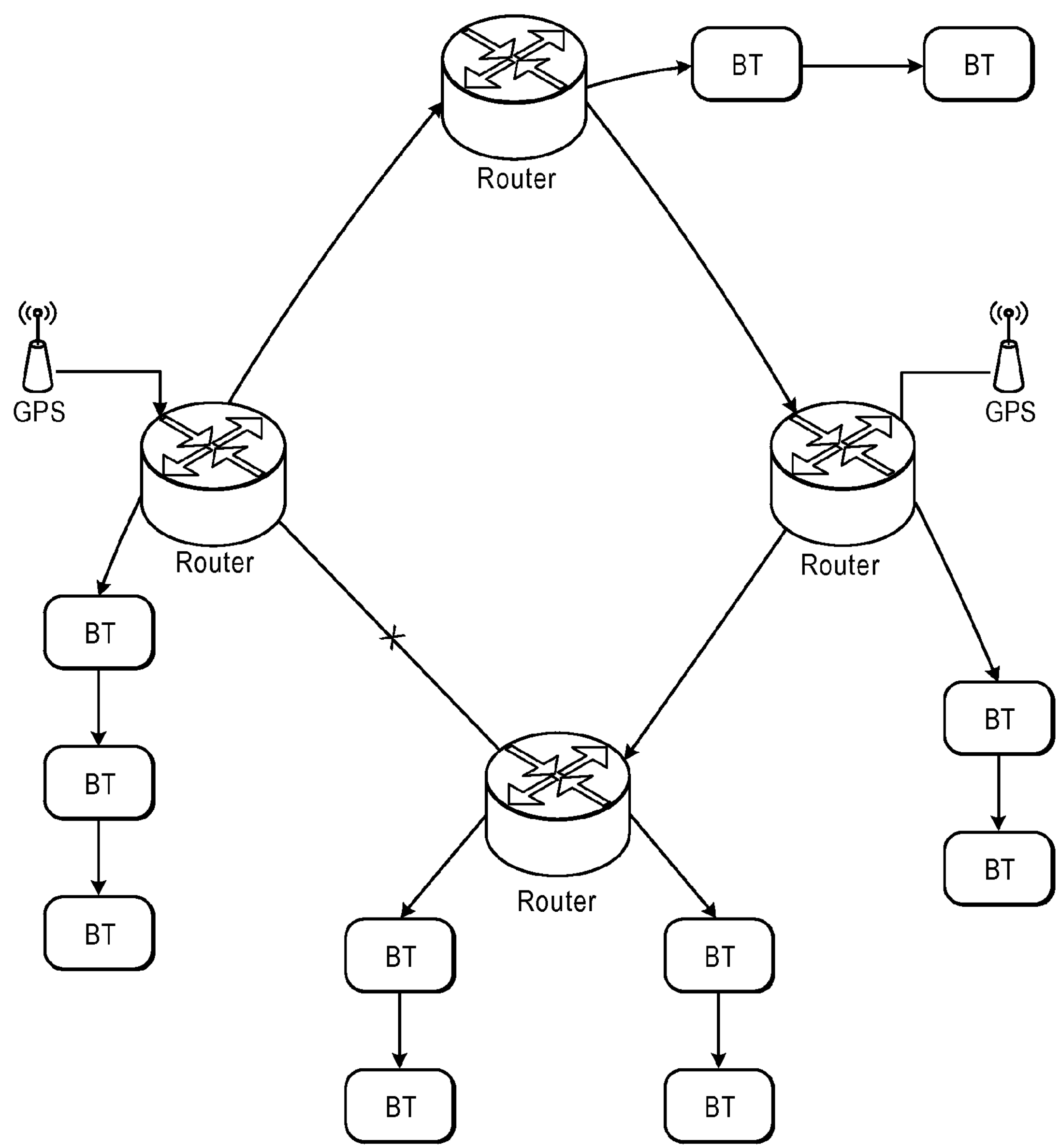
FIG. 7 shows propagation of a clock signal in ring- or mesh-like networks in some embodiments.

FIG. 7 shows propagation of a clock signal in ring- or mesh-like networks 700 in some embodiments. In some embodiments, a PRBS random pattern is transported over the Aux channel. Clock quality information or other status information may be stored in the channel so as to allow switching to alternative clock sources in the case of failure.

The network 700 comprises of a ring backbone with four routers 702, 704, 706, and 708 and spurs with base stations 710, 712, 714, 716, 718, 720, 722, 724, 726, 728, and 730. All nodes may be interconnected by radio. There may be two GPS clock sources 732 and 734. In some embodiments, all nodes receive a clock from a Master GPS as shown below by arrows.

In case of GPS receiver or link failure a switch may select different input as a clock source. Selection may be done based on SSM messages (e.g., indicating clock quality information or other status information), which indicates quality of a clock received at each input. The following diagram depicts clock propagation when link between two routers failed (i.e., at the x between routers 702 and 704).

The Aux channel may carry messages (e.g., SSM messages) in addition to a synchronization value. In one example, when a clock signal is propagated by E1/DS1, the SSM may be carried in the E1/DS1 overhead. The NSM may also be able to carry the SSM messages through 64 Kbps auxiliary channel. SSM messages may be extracted at NSM inputs (e.g., both E1/DS1 and 64 Kbps) and inserted at outputs.

In some embodiments, the NSM architecture comprises a 64 Kbps auxiliary channel which, when used to carry a synchronization value, may provide a way to carry clock traceability information (SSM information). Frame format SF (D4) or ESF may be configured for DS1 inputs. This configuration may be on per port basis. Further, Sa-bit used for SSM information may be selected for E1 inputs. This configuration may also be on per port basis.

The NSM card may extract SSM information from E1/DS1 inputs (when available) and map it into 64 Kbps auxiliary channel. When E1/DS1 input does not have SSM information, the NSM card may include a SSM indicating "traceability unknown" in the 64 Kbps channel. When E1/DS1 input is lost and NSM card uses an internal clock to generate 64 Kbps stream, a SSM indicating "equipment internal clock" may be inserted into 64 Kbps channel.

In some embodiments, when the NSM recovers a clock from a 64 Kbps channel, the NSM may use SSM information from the 64 Kbps channel and include the SSM information in the generated E1 or DS1 output. When 64 Kbps channel is not available due to upstream path failure and the NSM uses an internal clock to generate E1/DS1 output, an SSM indicating "equipment internal clock" may be used.

An E1/DS1 port may be configured as an independent input and output or as a "pair." The "pair" mode may indicate that the port provides bi-directional communication with another device and that direction of clock propagation could reverse depending on overall network status.

When the E1/DS1 signal coming out of a port is generated using the clock, which originally was received through the same port, and the port is configured as "pair," the SSM indicating "Do not use for synchronization" may be used for this output. This may limit or prevent clock loops. In some embodiments, all other ports output may include actual SSM information.

Figure 8:
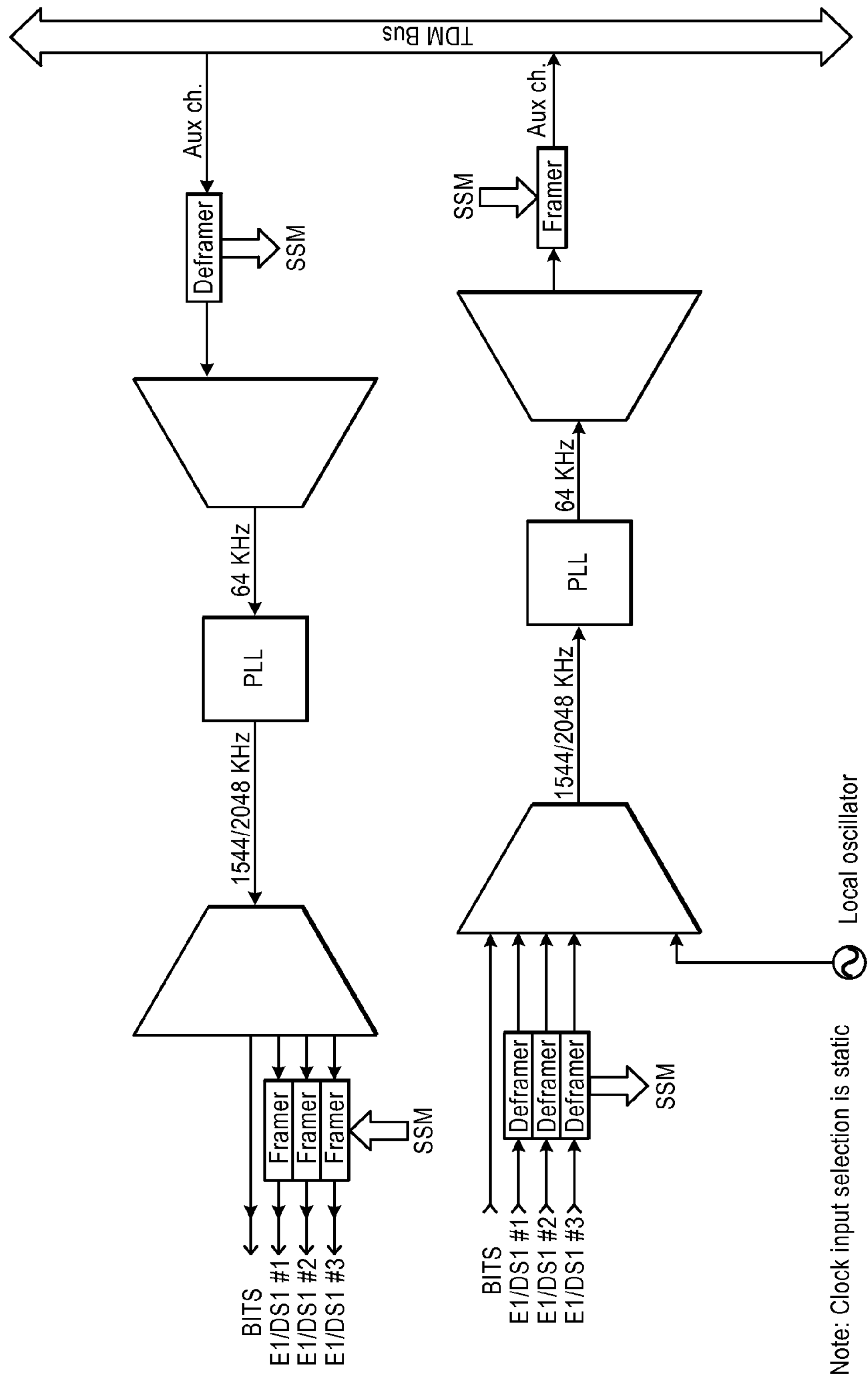
FIG. 8 is an exemplary NSM configured to retrieve and input SSM in some embodiments.

FIG. 8 is an exemplary NSM 800 configured to retrieve and input SSM in some embodiments. FIG. 8 comprises components of FIG. 5 as well a deframer 802 configured to retrieve SSM from the TDM bus over the Aux. channel. The SSM may be provided over E1/DS1 #1-3 by framers 804. Those skilled in the art will appreciate that the framers 804 may be a part of the LIU 414 or the FPGA 416.

Figure 9:
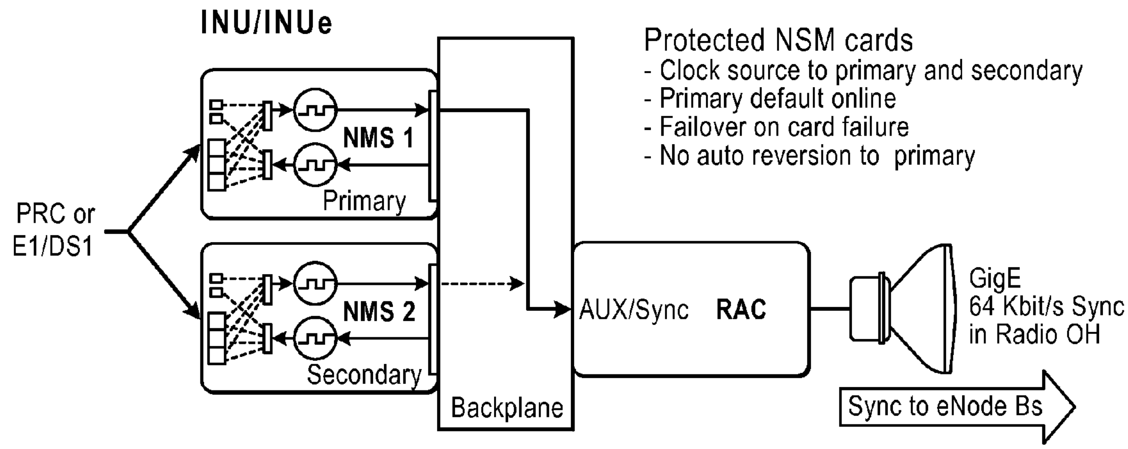
FIG. 9 depicts NSM redundancy in some embodiments.

FIG. 9 depicts NSM redundancy in some embodiments. In various embodiments, two NSMs, NSM 1 and 2, may be operably coupled to an RAC. If one of the NSMs fails, the other may provide a synchronization value to the RAC. Further, if PRC is inaccurate or there is a loss of signal, either NSM 1 or NSM 2 may provide a synchronization value via E1/DS1.

Those skilled in the art will appreciate that the two NSMs share inputs from the PRC and the E1/DS1. As a result, redundancy is provided if one of the two NSMs fail or if only part of one NSM fails (e.g., PRC input to the NSM 1 failed but the PRC input may be provided to the RAC by NSM 2).

In other embodiments, the PRC signal may be received only by the NSM 1 and the E1/DS1 clock signal may be received by NSM 2. If the PRC signal fails or is otherwise found inaccurate, the NSM 2 may provide a synchronization value to the RAC based on the E1/DS1 clock signal.

Further, in some embodiments, a single NSM may support both receiving a PRC signal in at least one port and an E1/DS1 clock signal in at least one other port. If a port or a PRC signal fails or is otherwise inaccurate, the NSM may provide the synchronization value associated with the E1/DS1 clock signal to the RAC.

Figure 10:
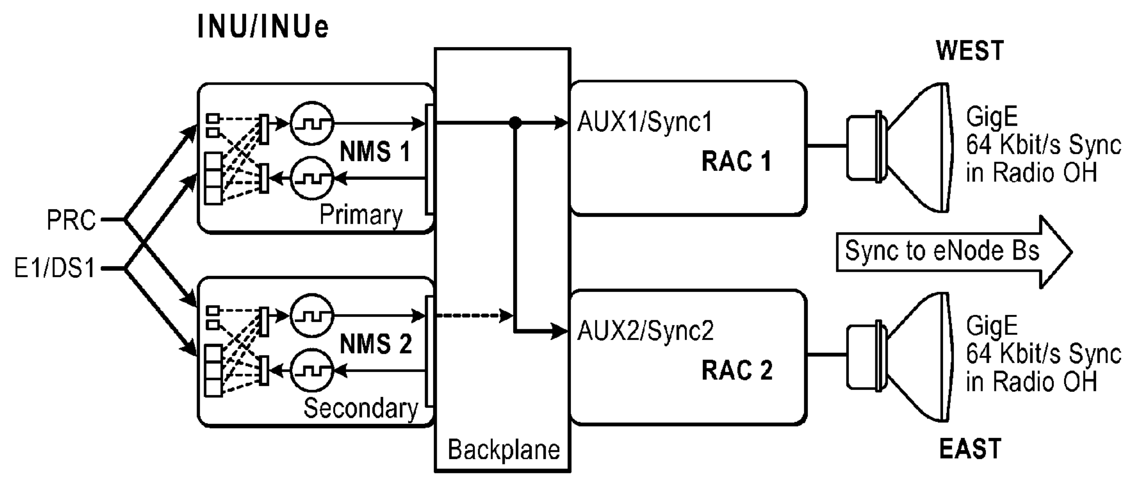
FIG. 10 depicts NSM and radio access card (RAC) redundancy in some embodiments.

FIG. 10 depicts NSM and RAC redundancy in some embodiments. In various embodiments, two NSMs, NSM 1 and 2, may be operably coupled to two RACs (i.e., RAC 1 and RAC 2). In some embodiments, this circuit provides the advantages of the circuit depicted in FIG. 9 but may also provide redundancy if one of the RACs fail. In some embodiments, the components depicted in FIG. 10 may be used in conjunction with clocks received from a ring network.

Those skilled in the art will appreciate that the two NSMs share inputs from the PRC and the E1/DS1. As a result, redundancy is provided if one of the two NSMs fail or if only part of one NSM fails (e.g., PRC input to the NSM 1 failed but the PRC input may be provided to the RAC by NSM 2).

Figure 11:
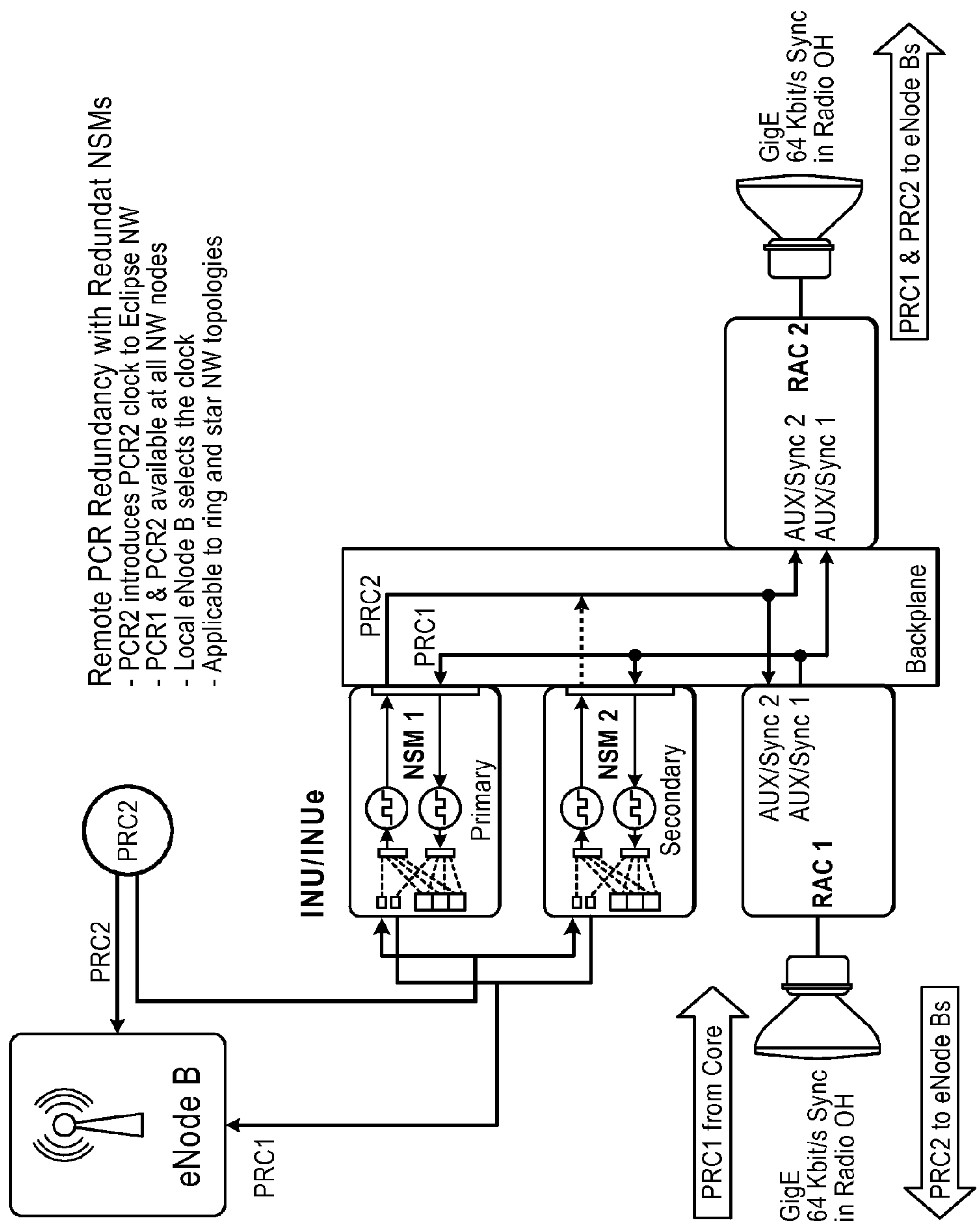
FIG. 11 depicts NSM redundancy in a ring network in some embodiments.

FIG. 11 depicts NSM redundancy in a ring network in some embodiments. In some embodiments, PRC 1 may be supported by a clock (sub-master PRC2) at a different point in the network. FIG. 11 illustrates the node supporting the remote PRC2 clock. Clock sourcing for PRC1 or PRC2 at the local eNode B may be an eNode B function. NSM clocking may be transported in AUX1 and AUX2. In other embodiments, PRC 1 and 2 are not provided and the NSM synchronizes the eNode B.

The above-described functions and components can be comprised of instructions that are stored on a storage medium such as a computer readable medium. The instructions can be retrieved and executed by a processor. Some examples of instructions are software, program code, and firmware. Some examples of storage medium are memory devices, tape, disks, integrated circuits, and servers. The instructions are operational when executed by the processor to direct the processor to operate in accord with embodiments of the present invention. Those skilled in the art are familiar with instructions, processor(s), and storage medium.

The present invention is described above with reference to exemplary embodiments. It will be apparent to those skilled in the art that various modifications may be made and other embodiments can be used without departing from the broader scope of the present invention. Therefore, these and other variations upon the exemplary embodiments are intended to be covered by the present invention.

What is claimed:

1. A system comprising:

a root node configured to receive a first clock signal at a first port, to generate a first frame including a first overhead portion, the first overhead portion comprising a synchronization value based on at least one parameter of the first clock signal, and to determine whether a second clock signal has failed or is inaccurate, the second clock signal being received at a second port of the root node;

a radio channel network in communication with the root node for transmitting the first frame; and a first child node including a first phase lock loop, the first child node configured to receive the first frame and to synchronize at least one parameter of the first phase lock loop with the at least one parameter of the first clock signal using the synchronization value in the first overhead portion of the first frame.

2. The system of claim 1, wherein the second clock signal is determined to have failed when there is a loss of the second clock signal.

3. The system of claim 1, further comprising a second child node including a second phase lock loop, the second child node configured to receive a second frame, the second frame including a second overhead portion, the second overhead portion comprising the synchronization value, the second child node configured to synchronize at least one parameter of the second phase lock loop with the at least one parameter of the first clock signal using the synchronization value in the second overhead portion of the second frame.

4. The system of claim 1, wherein the first clock signal is provided by a primary reference clock (PRC) source.

5. The system of claim 1, wherein the first clock signal is provided by an E1 signal or a DS1 signal.

6. The system of claim 1, wherein the first child node is configured to attenuate jitter of the first frame.

7. The system of claim 1, wherein the root node is further configured to generate a first series of frames for the first child node and to generate a first series of synchronization values for the first frame.

8. The system of claim 1, wherein the synchronization value includes a pseudorandom sequence.

9. The system of claim 1, further comprising an intermediate child node configured to receive the first frame from the root node before the first child node receives the first frame.

10. The system of claim 9, wherein the intermediate child node is configured to attenuate jitter of the first frame.

11. The system of claim 1, wherein the at least one parameter of the first clock signal comprises a frequency of the first clock signal, and the at least one parameter of the first phase lock loop comprises a frequency of the first phase lock loop.

12. The system of claim 1, wherein the at least one parameter of the first clock signal comprises a phase of the first clock signal, and the at least one parameter of the first phase lock loop comprises a phase of the first phase lock loop.

13. A method comprising:

receiving a first clock signal by a first port of a root node;

determining, by the root node, whether a second clock signal has failed or is inaccurate, the second signal being received at a second port of the root node;

generating, by the root node, a first frame including a first overhead portion, the first overhead portion comprising a synchronization value, the synchronization value being based on at least one parameter of the first clock signal;

transmitting the first frame over a radio channel network;

receiving, by a first child node, the first frame; and synchronizing, by the first child node, at least one parameter of a first phase lock loop with the at least one parameter of the first clock signal using the synchronization value in the first overhead portion of the first frame.

14. The method of claim 13, wherein the second clock signal is determined to have failed when there is a loss of the second clock signal.

15. The method of claim 13, further comprising:

generating, by the root node, a second frame including a second overhead portion, the second overhead portion comprising the synchronization value;

transmitting the second frame over the radio channel network;

receiving, by a second child node, the second frame; and synchronizing, at the second child node, at least one parameter of a second phase lock loop with the at least one parameter of the first clock signal using the synchronization value in the second overhead portion of the second frame.

16. The method of claim 13, wherein the first clock signal is provided by a primary reference clock (PRC) source.

17. The method of claim 13, wherein the first clock signal is provided by an E1 signal or a DS1 signal.

18. The method of claim 13, further comprising attenuating jitter of the first frame by the first child node.

19. The method of claim 13, further comprising generating a first series of frames for the first child node by the root node and generating a first series of synchronization values for the first frame.

20. The method of claim 13, wherein the synchronization value includes a pseudorandom sequence.

21. The method of claim 13, further comprising receiving, by an intermediate child node, the first frame from the root node before the first child node receives the first frame.

22. The method of claim 21, further comprising attenuating jitter of the first frame by the intermediate child node.

* * * * *